(12) United States Patent
Norris et al.

(10) Patent No.: US 12,566,372 B2
(45) Date of Patent: Mar. 3, 2026

(54) METHOD FOR PRODUCING A NANO-STRUCTURED ELEMENT MADE OF HEXAGONAL BORON NITRIDE AND DEVICE COMPRISING SUCH AN ELEMENT

(71) Applicant: ETH ZURICH, Zürich (CH)

(72) Inventors: David J. Norris, Zürich (CH); Nolan Lassaline, Zürich (CH); Deepankur Thureja, Untersiggenthal (CH)

(73) Assignee: ETH ZURICH, Zurich (CH)

( * ) Notice: Subject to any disclaimer, the term of this patent is extended or adjusted under 35 U.S.C. 154(b) by 118 days.

(21) Appl. No.: 18/563,638

(22) PCT Filed: May 19, 2022

(86) PCT No.: PCT/EP2022/063503
§ 371 (c)(1),
(2) Date: Nov. 22, 2023

(87) PCT Pub. No.: WO2022/248319
PCT Pub. Date: Dec. 1, 2022

(65) Prior Publication Data
US 2024/0255844 A1     Aug. 1, 2024

(30) Foreign Application Priority Data
May 27, 2021    (EP) ..................................... 21176194

(51) Int. Cl.
*G03F 7/00* (2006.01)
*G03F 7/20* (2006.01)
(52) U.S. Cl.
CPC .......... *G03F 7/0002* (2013.01); *G03F 7/2049* (2013.01); *G03F 7/705* (2013.01)

(58) Field of Classification Search
CPC ....... G03F 7/0002; G03F 7/2049; G03F 7/705
See application file for complete search history.

(56) References Cited

U.S. PATENT DOCUMENTS 6,864,931 B1 * 3/2005 Kumar .............. G02F 1/133377
                                                    349/201
2005/0248705 A1 * 11/2005 Smith .................. G02B 5/3016
                                                    349/124

(Continued)

FOREIGN PATENT DOCUMENTS

WO        2021/013533 A1     1/2021

OTHER PUBLICATIONS

Sejeong Kim et al., "Phototonic Crystal Cavities from Hexagonal Boron Nitride", arxiv.org, Jan. 13, 20218, pp. 1-12, XP081133741.

(Continued)

*Primary Examiner* — Deoram Persaud
(74) *Attorney, Agent, or Firm* — Sughrue Mion, PLLC

(57)        ABSTRACT

A method is indicated for producing a nano-structured element (1) made of hexagonal boron nitride (hBN). The method comprises the steps of a.) generating a relief structure (4) in the surface (31) of a resist (3), the resist in particular being a polymer resist (3); of b.) placing the resist (3) on the hBN-element (1); and of c.) transferring the relief structure (4) from the resist (3) into the hBN-element (1) by means of etching. Furthermore, a device is indicated comprising one or several nano-structured hBN-elements (1), the one or several hBN-elements (1) having a relief structure (4) provided for the targeted influencing of the electronic, optical and/or mechanical properties of the device.

19 Claims, 12 Drawing Sheets

(56)                    References Cited

U.S. PATENT DOCUMENTS

| | | | |
|---|---|---|---|
| 2009/0046349 A1* | 2/2009 | Haddock ................ | G02C 7/083 |
| | | | 359/574 |
| 2013/0284598 A1* | 10/2013 | Duerig ................... | C25D 13/22 |
| | | | 204/451 |
| 2016/0313572 A1* | 10/2016 | Haddock ................ | G02C 7/083 |
| 2017/0003602 A1* | 1/2017 | Duerig ................ | G03F 7/70591 |
| 2020/0259065 A1 | 8/2020 | Aleman et al. | |
| 2024/0128395 A1* | 4/2024 | Imamoglu ............. | H10F 77/206 |
| 2025/0147222 A1* | 5/2025 | Traub ................... | G02B 5/1809 |

OTHER PUBLICATIONS

Nolan Lassaline et al., "Optical Fourier surfaces", Nature, Jun. 25, 2020, 19 pages, vol. 582, No. 7813, XP037177137.
T. S. Kulmala et al., "Single-nanometer accurate 3D nanoimprint lithography with master templates fabricated by NanoFrazor lithography", Proceedings of SPIE, Mar. 19, 2018, pp. 1058412-1-1058412-8, vol. 10584.
Peining Li et al., "Infrared hyperbolic metasurface based on nanostructured van der Waals materials", Science, 2018, pp. 892-896, 359, http://science.sciencemag.org/content/359/6378/892.
Bjarke S. Jessen et al., "Lithographic band structure engineering of graphene", Nature Nanotechnology, Apr. 2019, pp. 340-346, vol. 14, https://doi.org/10.1038/s41565-019-0376-3.
International Search Report for PCT/EP2022/063503, dated Sep. 19, 2022.
Written Opinion for PCT/EP2022/063503, dated Sep. 19, 2022.

* cited by examiner

METHOD FOR PRODUCING A NANO-STRUCTURED ELEMENT MADE OF HEXAGONAL BORON NITRIDE AND DEVICE COMPRISING SUCH AN ELEMENT

CROSS REFERENCE TO RELATED APPLICATIONS

This application is a National Stage of International Application No. PCT/EP2022/063503 filed May 19, 2022, claiming priority based on European Patent Application No. 21176194.5 filed May 27, 2021.

TECHNICAL FIELD

The present invention relates to a method for producing a nano-structured element made of hexagonal boron nitride (hBN) as well as to a device comprising one or several nano-structured elements made of hBN. The hBN-elements serves to generate a certain electronic, optical and/or mechanical effect.

PRIOR ART

Hexagonal boron nitride (hBN) is a layered crystal, like graphite and molybdenum disulfide, that can be exfoliated from thin flakes down to monolayer sheets while maintaining pristine, atomically smooth surfaces. hBN has long been known as a thermally stable ceramic and is increasingly used in the form of atomically smooth, single-crystalline flakes, in particular in the field of optoelectronics. At nanoscale thicknesses, such crystals, known as two-dimensional (2D) materials, exhibit unique electronic and optical properties. For e.g. nanophotonics, these flakes offer strong nonlinearities, hyperbolic dispersion, and single-photon emission, providing unique properties for optical and quantum-optical applications. For nanoelectronics, their pristine surfaces, chemical stability, and wide bandgap have made them a key substrate, encapsulant, and gate dielectric for many types of two-dimensional electronic devices.

Moreover, different 2D materials can be selected, stacked, and stuck together via van der Waals (vdW) forces, providing a flexible route to 'designer' materials for the discovery of unexpected phenomena and the creation of optoelectronic devices with unprecedented performance. These 'vdW heterostructures' continue to advance rapidly due to a growing library of 2D materials combined with stacking innovations (for example, twisted bilayers).

Yet, while the active layers and electrode materials in these devices can be varied, hBN has remained an irreplaceable component for many applications. First identified as the ideal substrate for graphene electronics, hBN is now ubiquitous because of its special ability to surround, protect, and isolate 2D materials. In addition, hBN is increasingly investigated for nanophotonic applications, offering infrared hyperlensing, room-temperature single-photon emitters, and bright deep-ultraviolet sources.

In general, common applications of hBN have utilized simple, flat flakes with thicknesses from a monolayer to hundreds of nanometers. Following lessons from silicon electronics, patterning hBN flakes is a potential strategy to enable more sophisticated functionalities, especially as the hBN typically occupies most of the device volume. In 2D electronics, its structure can influence active layers through modulation of their mechanical, electrostatic, and electromagnetic environments. In photonics, the hBN structure can lead to deterministic quantum emitters, waveguides, and metasurfaces.

For this purpose, flat flakes or flakes patterned with basic slits and holes have been used, as described e.g. by Li, P., Dolado, I., Alfaro-Mozaz, F. J., Casanova, F., Hueso, L. E., Liu, S., Edgar, J. H., Nikitin, A. Y., Vélez, S. & Hillenbrand, R. *Infrared hyperbolic metasurface based on nanostructured van der Waals materials. Science* 359, 892-896 (2018) and by Jessen, B. S., Gammelgaard, L., Thomsen, M. R., Mackenzie, D. M. A., Thomsen, J. D., Caridad, J. M., Duegaard, E., Watanabe, K., Taniguchi, T., Booth, T. J., Pedersen, T. G., Jauho, A.-P. & Bøggild, P. Lithographic band structure engineering of graphene. *Nat. Nanotechnol.* 14, 340-346 (2019). It could be shown that by means of patterning the hBN-flakes it is possible to manipulate the flow of photons, electrons and excitons.

In the state of the art, it is known to use hBN-elements that are produced by standard patterning techniques such as electron-beam lithography and focused ion-beam milling. These standard patterning techniques, however, severely constrain the choice of designs for the hBN-elements.

In WO 2021/013533 A1 of the same applicant, a method is disclosed to generate a continuous relief structure in a substrate, in order to produce a diffractive optical element made of glass or metal.

SUMMARY OF THE INVENTION

It is an object of the present invention to provide a method for producing an hBN-element, which allows to arbitrarily shape the hBN-element with freely varying profiles and preferably with features in the nanometer-range.

In order to solve this object, the present invention provides a method for producing a nano-structured element made of hexagonal boron nitride (hBN), comprising the steps of:

a.) placing a resist, in particular a polymer resist, on the hBN-element;

b.) generating a relief structure in the surface of the resist; and c.) transferring the relief structure from the resist into the hBN-element by means of etching, in particular by means of reactive-ion etching.

It has surprisingly been found by the inventors that an arbitrary shaping of hBN-elements becomes possibly by first generating a relief structure in a resist and then transferring the relief structure from the resist into the hBN-element by means of etching. In this way, it is possible to shape the hBN-elements with freely varying profiles and with features having dimensions in the nanometer-range. In this way, more sophisticated shapes of hBN-elements become possible, which might lead to previously unattainable structures for controlling photons, electrons, and excitons. The nano-structured hBN-element(s) can particularly be used for band-structure engineering. Furthermore, patterned hBN-elements can be used for mechanical strain engineering. The capabilities of nano-structured hBN-elements also has the potential to discover and exploit emerging phenomena in hyperbolic metamaterials, polaritonics, twistronics, quantum materials and two-dimensional optoelectronic devices.

In the context of this document, a nano-structured element is regarded as an element having surface structures with dimensions in the nanometer-range. A surface structure or feature having dimensions in the nanometer-range is regarded as a surface structure with dimensions of less than 10 $\mu$m, preferably of more than 10 nm, along the horizontal direction (i.e. in parallel to the surface) and/or with dimensions of less than 10 nm, preferably of more than 0.1 nm, along the vertical direction (depth, i.e. perpendicular to the surface).

The hBN-element is preferably made to a major part, more preferably completely, of hexagonal boron nitride. The hBN-element preferably has a flattened shape, e.g. in the form of one or several flakes.

The steps a.), b.) and c.) are preferably, but not necessarily, carried out in the temporal order as indicated.

In step a.), before placing the resist on the hBN-element, preferably the hBN-element is deposited on a substrate. The substrate can particularly be made of silicon dioxide ($SiO_2$) and is preferably in the form of a wafer. The hBN-element is advantageously deposited, e.g. in the form of flakes, on the substrate using a mechanical exfoliation technique.

The relief structure is preferably designed using a mathematical formula. Thus, the relief structure can preferably be described by a mathematical formula, more preferably by a mathematical formula containing one or more continuous functions, in particular sinusoidal functions, Bessel functions and/or Gaussian functions.

For the etching in step c.), preferably reactive-ion etching, more preferably inductively coupled plasma (ICP) etching is applied using sulfur hexafluoride ($SF_6$). The relief structure is advantageously, but not necessarily, transferred 1:1 into the hBN-element, i.e. such that no amplification or reduction of the relief structure occurs from the resist to the hBN-element. Depending on the application, it might also be advantageous to make use of certain amplification or reduction, for example an amplification or reduction of certain feature dimensions (e.g. in the horizontal and/or the vertical direction) by more than 20% or more than 50%, during the etching process.

In a particularly preferred embodiment, in step b.), thermal scanning-probe lithography is used to generate the relief structure directly in the surface of the resist. In this way, the relief structure can be created in the hBN-element in a particularly precise and accurate way. The resist can be made of a polymer, in particular of a thermoplastic polymer.

In another, also particularly preferred embodiment, in step b.), a stamp comprising the relief structure is used to generate the relief structure in the surface of the resist. Thus, in this embodiment, the relief structure is provided in the form of a stamp that is used to create the relief structure in the surface of the resist. This process is also referred to as nanoimprint-lithography. In order to create the relief structure, the stamp can e.g. be pressed into the surface of the resist. The use of a stamp allows the production of a large number of nano-structured hBN-elements within a comparatively short period. Thus, the stamp is advantageously used to create a plurality of hBN-elements each having the same relief structure.

For creating the stamp, thermal scanning-probe lithography is preferably applied on an imprint-substrate, in order to generate the relief structure in the surface of the imprint-substrate. The imprint-substrate comprising the relief structure is then preferably used to create the stamp. The imprint-substrate can particularly be made of a polymer, in particular of a thermoplastic polymer. For example, the imprint-substrate can be used as a part, e.g. an insert, of a mold for molding the stamp, or, what is more preferred, the stamp is created by transferring the relief structure from the imprint-substrate to the surface of the stamp by means of etching, in particular by means of reactive-ion etching. In particular in the latter case, in which the relief structure is etched into the surface of the stamp, the stamp can preferably be made of silicon. In another, also preferred example, the relief structure can be transferred from the imprint-substrate to a substrate, in particular a substrate made of silicon, by means of etching, in particular by means of reactive-ion etching, and the patterned substrate can then be used as a part, e.g. an insert, of a mold for molding the stamp. In this case, the stamp is preferably made of nickel, in particular a nickel alloy. In yet another possible example, thermal scanning-probe lithography can also be directly applied on the surface of the stamp, in order to generate the relief structure directly in the surface of the stamp.

In thermal scanning-probe lithography, a processing device is usually used to generate a relief structure in the surface of the resist or of the imprint-substrate. The processing device comprises a probe having a tip. The probe preferably has the form of a cantilever.

The tip of the probe preferably has a radius that is smaller than about 1 μm, more preferably smaller than about 20 nm. In a particularly preferred embodiment, the probe tip even has a radius of 8 nm or less, more preferably of 4 nm or less. Moreover, it is preferred for the probe tip to have a half-angle of 30° or less, preferably of 20° or less. With such a probe, nano-structures can be created in hBN having dimensions that are suitable for causing various optoelectronic effects in a targeted way.

The resist or imprint-substrate usually has a surface extending in a first direction and a second direction running perpendicularly to the first direction. In the thermal scanning-probe lithography, the probe is preferably movable in the first direction, the second direction and a third direction running perpendicularly to the first direction and the second direction with respect to the resist or imprint-substrate, wherein the relief structure is generated by an action of the tip on the surface of the resist or imprint-substrate.

The relief structure is preferably generated by a mechanical and/or thermal action of the probe tip on the surface of the resist or imprint-substrate. The tip can be in direct contact with the surface of the resist or imprint-substrate upon the generation of the relief structure. That is, the tip of the probe can immediately act onto the surface of the resist or imprint-substrate and for example remove parts of the resist or imprint-substrate when it acts upon. A mechanical action can be a physical removal of material from the surface of the resist or imprint-substrate, i.e. a subtractive technique where material is selectively removed from the surface of the resist or imprint-substrate. A thermal action can be applied by means of a heated tip, for example, where material from the surface of the resist or imprint-substrate is selectively thermally decomposed and/or removed. A heating of the tip can be achieved by applying an electrical current to the probe and thus the tip. It is of course possible that these actions are combined and that a heated tip is used to mechanically remove material from the resist or imprint-substrate. In any case, a removal of material from the surface in the third direction is achieved by moving or pushing the heated probe and thus the tip along the third direction into the surface of the resist or imprint-substrate. Preferably by varying the strength of the force that is applied by the probe to the surface along the z direction, the depth of the relief structure with respect to the third direction is controlled. The processing device preferably corresponds to a thermal scanning-probe lithography device as it is known in the art. Hence, it is particularly preferred to use a commercially available thermal scanning-probe lithography device. The usage of such a processing device, in particular because of its spatial resolution, enables the generation of a relief structure with features in the nanometer-range. A further advantage that is associated with such a device lies in the preferably provided capability of the probe to read out and analyze the relief structure that is generated upon its generation. That is, the tip can be used to scan over the surface of the sample while it writes/creates/patterns the relief structure into the surface of the sample and at the same time also reads or images the relief structure. This generates a closed-loop feedback system that results in an accurate and precise profile of the surface relief structure.

The probe can be moved in the first direction and/or in the second direction in steps of about 0.1 nanometer to 50 micrometer, in particular in steps of about 0.1 nanometer to 100 nanometer, preferably in steps of 5 nanometer to 50 nanometer, particularly preferably in steps of less than about 20 nanometer. Additionally or in the alternative the probe can be moved in the third direction in steps of about 0.1 nanometer to 1 micrometer, preferably in steps of 0.2 nanometer to 25 nanometer, particularly preferably in steps of less than about 2 nanometer.

By moving the probe, and thus the tip, along at least one of the first direction and the second direction in the just-mentioned steps, it is possible to generate a relief structure having a plurality of elevations and recesses extending along the first direction and/or the second direction. Moreover, by using a probe having a tip as described initially it is possible to generate a relief structure wherein a minimal horizontal distance between two successive elevations or recesses when seen along the first direction and the second direction, respectively, is smaller than about 50 nanometer. In particular, the minimal horizontal distance is about 20 nanometer. Moreover, it is likewise possible to generate a relief structure having a maximum depth that is in the range of about 4 to 20 nanometer. Said depth extends in the third direction running perpendicularly to the first direction and the second direction of the surface, and thus of the resist or imprint-substrate, and is formed between two successive elevations or recesses when seen along the first direction and the second direction, respectively.

If d denotes the depth of the relief structure (also referred to as vd in this document), then w(d), which is the width of the indents, or in other words the horizontal distance between two successive elevations or two successive recesses (also referred to as hd), preferably obeys the following relationship:

$$w(d) \geq w_0 + 2d\tan\theta_{half} + w_m$$

where $w_0$ is the probe width at the apex ($w_0=2R$, with R being the radius of the probe tip), $\theta_{half}$ is the opening half-angle of the probe tip, and $w_m$ represents additional feature broadening beyond the probe shape due to mechanical deformations. Furthermore, w(d) preferably also obeys the following relationship for each of two successive elevations or two successive recesses:

$$w(d) \leq x(w_0 + 2d\tan\theta_{half} + w_m)$$

wherein x is 2, more preferably 1.5.

The probe, and thus the tip, can preferably be moved in the first direction and/or the second direction with a rate of between about 1 hertz to 1'000 kilohertz, more preferably between about 1 kilohertz to 500 kilohertz. At the same time it is conceivable that the tip acts on the surface of the resist or imprint-substrate. In other words, it is conceivable that the probe is configured to pattern the relief structure at a rate of between about 1 hertz to 1000 kilohertz, preferably between about 1 kilohertz to 500 kilohertz. It is likewise conceivable that the probe is configured to simultaneously read the written pattern, i.e. to read the relief structure at the given rate. Additionally or alternatively the tip can be heated to a temperature in the range of about 100° C. to 1'500° C., preferably in the range of about 700° C. to 1'400° C. These parameters are set in accordance with the dimensions of the relief structure that shall be generated and adapted to the material of the resist or imprint-substrate, respectively.

The processing device can further comprise a controller configured to control the probe based on controller data that is fed into the controller, wherein the controller data defines the relief structure along a horizontal plane being spanned by the first direction and the second direction and is preferably based on one or more functions. The one or more functions preferably correspond to one or more continuous functions. The controller data is particularly preferably based on one or more sinusoidal functions, but can of course also be based on any other functions, also on non-continuous functions. Other examples of conceivable functions used to control the movements of the probe are Bessel functions or Gaussian functions. Hence, it is conceivable to base the controller data on one or more continuous and smooth functions. In this way the probe, and thus the tip, perform a continuous and possibly also smooth movement. The spatial profile that defines said continuous and possibly also smooth movement is then transferred into the surface of the resist or imprint-substrate upon the action of the tip onto the surface of the resist or imprint-substrate.

The resist or imprint-substrate preferably comprises or consists of a thermally sensitive material, preferably a polymer, particularly preferably a poly(methyl methacrylate-co-methacrylic acid), polyphthalaldehyde (PPA), or CSAR. CSAR corresponds to a copolymer on the basis of methyl styrene-co-α-chloromethacrylate with the addition of a halogenated acid generator as it is commercially available. Hence, the resist or imprint-substrate can comprise one or more polymers that are responsive to heat. In this case the heatable tip of the probe can be arranged on the surface of the resist or imprint-substrate and can locally decompose and/or remove the resist or imprint-substrate at locations where it comes into contact with the hot tip. However, a local removal of material of the resist or imprint-substrate is likewise conceivable by mechanical action of the tip only or by a combination of heating and mechanical action of the tip.

For placing the resist on the hBN-element in step a.), a material forming the resist is preferably spin-coated over the hBN-element.

The controller data used by the controller to control the probe during the thermal scanning-probe lithography is preferably generated by the steps of:

(i) defining the relief structure to be generated in a computing device, whereby a model relief structure is obtained; and (ii) discretizing the model relief structure of step (i) into pixels in the computing device, whereby discretized controller data is obtained, the discretized controller data preferably being stored in a digital file, particularly preferably in a bitmap file.

The computing device can correspond to a commercially available computing device as it is known in the art, for example a computer comprising the software tool MATLAB®. It should be noted that any other software tool capable of calculating and further processing the one or more functions mentioned above can be used, as well. Using the computing device, the model relief structure is subsequently preferably discretized into pixels, and said pixelated data is then stored in a digital file such as a bitmap file. The digital file comprises the controller data that is fed into the controller that controls the movements of the probe.

The pixels preferably have a length in the first direction and/or in the second direction of about 1 nanometer to 1 micrometer, preferably of about 10 nanometer. Moreover, it is preferred if the pixels are provided in the form of squared or rectangular pixels. Additionally or in the alternative it is preferred to discretize the pixels along the third direction to depth levels having a depth level number of at least $2^{\wedge}(m)$ in step (ii) mentioned above, wherein m is at least 3, preferably at least 5, particularly preferably at least 8. That is to say, the controller data preferably comprises a pixelated model relief structure which is discretized along the third direction into depth levels having a depth level number of at least 8, preferably of at least 32, particularly preferably of at least 256. The controller is preferably configured to assign the depth levels to a real depth, wherein the real depth corresponds to a depth of the desired relief structure along the third direction. For example, if the desired relief structure has a depth of 50 nanometers and if the controller data comprises a model relief structure having 256 depth levels along the third direction, the controller could be configured to act on the substrate along the third direction in steps of about 0.2 nanometer, i.e. 50 nanometers divided by 256. When generating the relief structure along at least one of the first and the second direction the force applied to the tip is preferably varied according to the depth level stored in the digital file. In the case of the controller data being based on continuous and possibly also smooth one or more functions, the digital file can be said to correspond to a gray-level digital file, where the force of the tip is applied according to the gray-level of the file. In the preferred case of a bitmap-file, the bitmap can be converted into the relief structure in the substrate, where the depth at one particular position in the first, second and third direction corresponds to a particular gray-level of the bitmap.

The relief structure can comprise a plurality of elevations and recesses, wherein the minimal distance between at least one of a) two successive elevations and b) two successive recesses is preferably smaller than about 100 nm, in particular smaller than about 50 nm. The maximum depth of the relief structure is preferably in a range between 4 nm and 20 nm, more preferably in a range between 4 nm and 10 nm.

The resist preferably has a thickness of between 1 nm and 1 µm in the region of the hBN-element. The resist is ideally provided as thin as possible to avoid prolonged etching during the subsequent transfer step into the hBN-element. However, if the resist is too thin, unwanted thermal transport from the probe tip to the underlying resist increases, limiting pattern quality. The thickness of the resist as indicated represents a trade-off that sets a lower limit on the thickness and, consequently, the pattern roughness that is accumulated during etching, which affects the minimum feature size in the final structure of the hBN-element.

The present invention also refers to a device comprising one or several nano-structured elements made of hexagonal boron nitride (hBN), in particular produced by means of the method as indicated above, the one or several hBN-elements having a relief structure provided for influencing the electronic, optical and/or mechanical properties of the device in a targeted way. The relief structure can particularly be designed as indicated further above.

By influencing the electronic, optical and/or mechanical properties in a targeted way it is meant that the respective relief structure is provided and has been patterned in the hBN-element specifically for this purpose of influencing the electronic, optical and/or mechanical properties.

In a particularly preferred embodiment, the one or several nano-structured elements form an integrated part of a heterostructure with several layers that are held together by means of van der Waals forces. The heterostructure can particularly be specifically designed to achieve a certain electronic, optical and/or mechanical effect. The one or several nano-structured elements can e.g. form a first layer which is arranged adjacent to another further layer or which is arranged between two further layers, wherein the one or two further layers can particularly be made of a different material than the first layer, and wherein the one or several nano-structured elements of the first layer are advantageously fixedly attached to the one or two further layers by means of van der Waals forces. The one or two further layers can for example be made of graphene. In this case, the one or several nano-structured hBN-elements can form the substrate and/or encapsulant for graphene electronics.

The one or several nano-structured elements can form an electronic Fourier-surface for modulating the electric field in a nearby active layer. Thus, the relief structure preferably forms a Fourier-surface in this case. Fourier-surfaces are described e.g. in Lassaline, N., Brechbühler, R., Vonk, S. J., Ridderbeek, K., Spieser, M., Bisig, S., Le Feber, B., Rabouw, F. T. & Norris, D. J. *Optical Fourier surfaces. Nature* 582, 506-510 (2020).

BRIEF DESCRIPTION OF THE DRAWINGS

Preferred embodiments of the invention are described in the following with reference to the drawings, which are for the purpose of illustrating the present preferred embodiments of the invention and not for the purpose of limiting the same. In the drawings.

DESCRIPTION OF PREFERRED EMBODIMENTS

In FIGS. 1a to 4, different aspects regarding the method of producing a nano-structured element 1 made of hexagonal boron nitride (hBN) comprising a relief structure 4 according to the invention are disclosed. The nano-structured element 1 made of hexagonal boron nitride can also be referred to as hBN-element or hBN-flake. With respect to FIGS. 5 to 8 and 10a to 10d, different experiments and examples of hBN-elements produced by a method according to the invention are shown. Measurements and simulations are also shown in these figures, in order to verify the feasibility as well as the accuracy and preciseness of the created relief structures. FIG. 9 illustrates the relationship of the shape and dimensions of the probe tip used for the thermal scanning-probe lithography with regard to the resolution and depth of the relief structure produced in the final hBN-element.

Figures 1A, 1B:
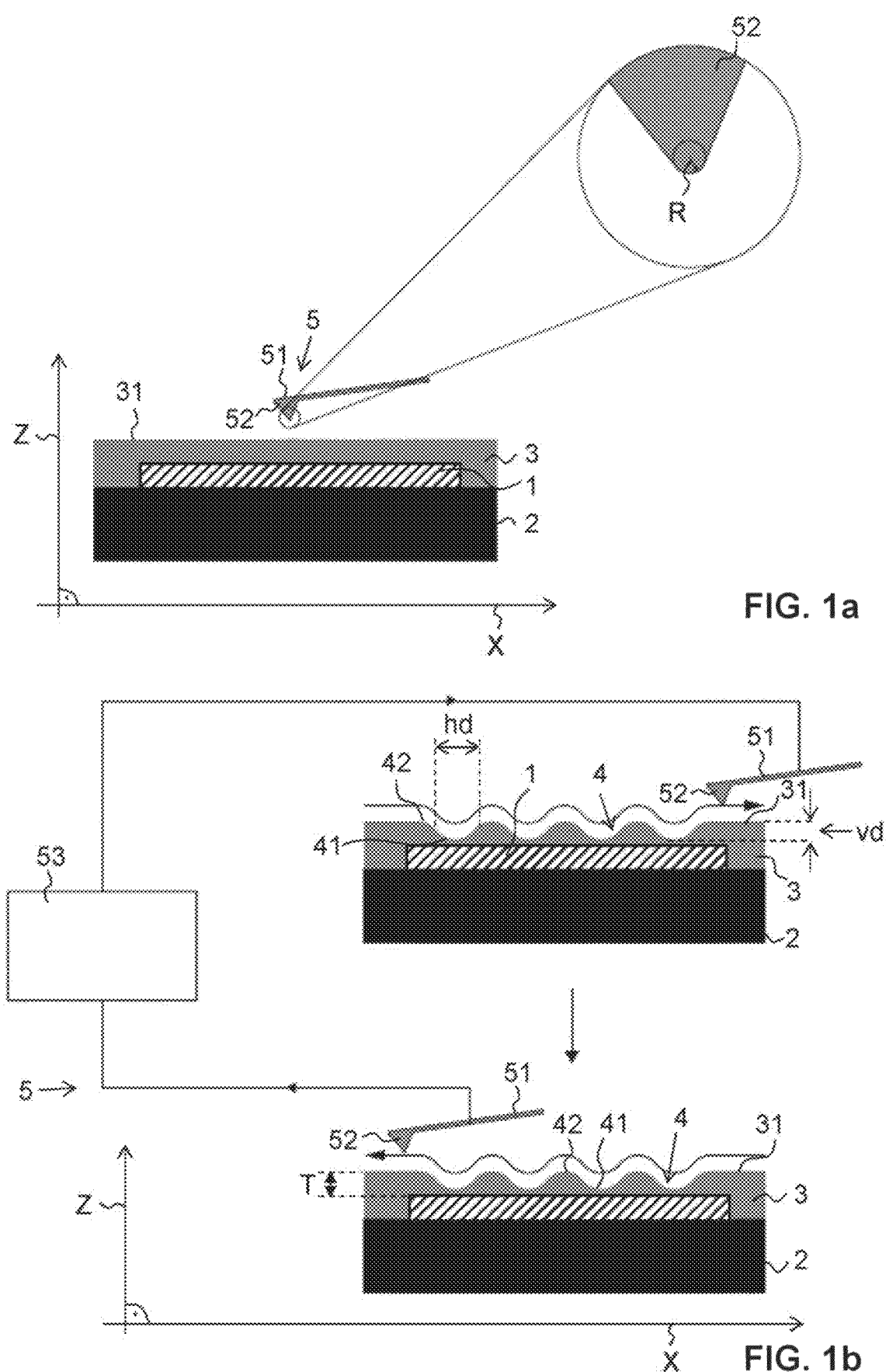
FIG. 1*a* shows a schematic illustration of a first step of a method for producing a nano-structured hBN-element according to a first inventive embodiment, wherein a processing device comprising a probe is about to act on a surface of a resist, in order to produce a relief structure.
FIG. 1*b* shows a schematic illustration of a second step of the method of producing a nano-structured hBN-element according to the first inventive embodiment, wherein the processing device comprising the probe acts on the surface of the resist (thermal scanning-probe lithography)
Figure 4:
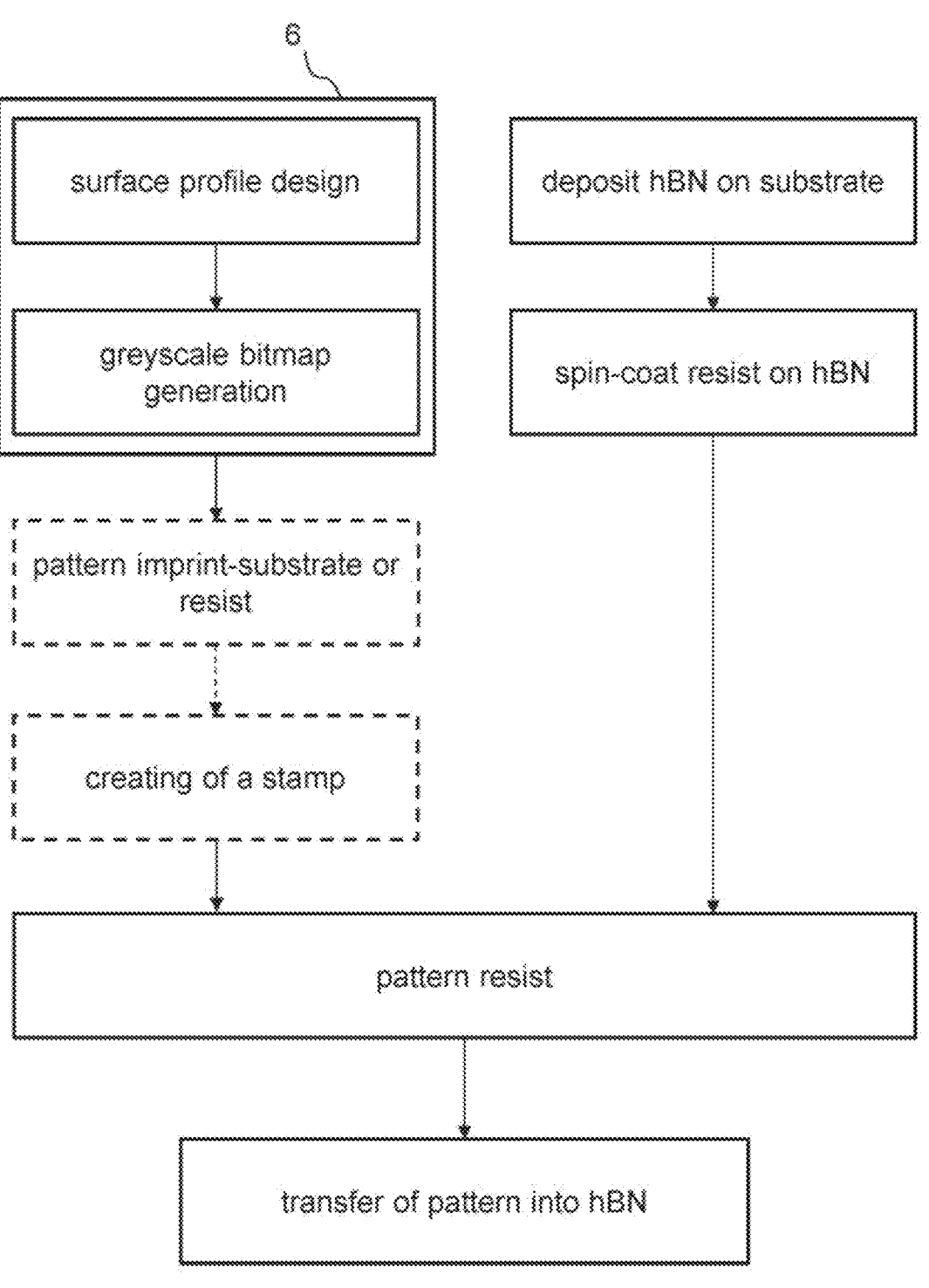
FIG. 4 shows a flow diagram illustrating the different method steps for producing a nano-structured hBN-element according to the invention.

Hence, as follows from FIGS. 1a to 1c the method of producing a nano-structured hBN-element is illustrated according to a first inventive embodiment. FIG. 4 shows the respective flow diagram of the same method (without considering the parts marked by dashed lines). The method comprises a first step in which a polymer resist 3 is placed on an hBN-element 1, preferably in such a way that it covers the entire hBN-element 1 or even a plurality of hBN-elements 1 (FIG. 1a). In preparation of this step, the hBN-element 1 has been arranged on a substrate 2 which can particularly be in the form of a $SiO_2$-wafer. For placing it on the hBN-element 1, the polymer resist 3 is preferably spin-coated over the hBN-element 1.

In a next step, a relief structure 4 is generated in the surface 31 of the polymer resist 3 using a processing device 5 adapted for thermal scanning-probe lithography. The polymer resist 3 extends in a first direction x, a second direction y running perpendicularly to the first direction x, and a third direction z running perpendicularly to the first direction x and the second direction y. The surface 31 of the polymer resist 3 extends in the first direction x and the second direction y, said first direction x and second direction y spanning a horizontal plane x-y. The processing device 5 comprises a probe 51 in the form of a cantilever having a tip 52. The tip 52 has a radius R that is about 3 nm in the fresh, i.e. initial status of the probe 51. The probe 51, and thus the tip 52, is movable in the first direction x, the second direction y and the third direction z with respect to the polymer resist 3 (FIG. 1*b*). The relief structure 4 is generated by an action of the tip 52 directly on the surface 31 of the polymer resist 3. The probe 51 is movable in the first direction x and in the second direction y in steps of e.g. about 0.1 nm to 50 μm, for example in steps of less than about 20 nm, and the probe 51 is movable in the third direction z in steps of about 0.1 nm to 1 μm, preferably in steps of less than about 2 nm. Due to these small movement steps a relief structure 4 comprising a plurality of recesses 41 and elevations 42 is generated, wherein a minimal horizontal distance hd between two successive elevations 42 and recesses 41 along the first direction x and the second direction y can be about 10 nm and a minimal depth vd that extends in the third direction z can be about 0.2 nm. The tip 52 is further configured to scan over the surface 31 of the relief structure 4 while it is acting upon the surface 31 of the polymer resist 3. This generates a closed-loop feedback system that results in an accurate and precise profile of the surface relief structure 4. This reading process is schematically indicated by the corrugated arrow in FIG. 1*b*.

The particular movements of the probe 51 are carried out according to particular controller data that is fed to a controller 53 of the processing device 5 being configured to control the probe 51. Said controller data defines the relief structure 4 along the horizontal plane x-y and can for example be based on one or more sinusoidal functions. In the case of two or more sinusoidal functions said sinusoidal functions can be summed up in a Fourier series.

As follows from FIG. 4, said controller data are generated in a computing device 6, whereby e.g. a Fourier surface design is calculated ("surface profile design" in FIG. 4) in a first step. In a next step, this surface profile design in the form of e.g. a Fourier surface design, which represents a model relief structure, is discretized into pixels, whereby discretized controller data is obtained that is stored in a digital file such as a grayscale bitmap file ("grayscale bitmap generation"). The grayscale bitmap file is fed to the controller 53 and used by the latter to control the probe 51 during the patterning process ("pattern resist" in FIG. 4). As described further above, prior to the patterning process, the hBN-element 1 is arranged on the substrate 2 ("deposit hBN on substrate") and the polymer resist 3 is spin-coated on the one or more hBN-elements 1 ("spin-coat resist on hBN"). After the patterning of the polymer resist 3 using thermal scanning-probe lithography, the pattern, i.e. the relief structure 4, is transferred into the hBN-element 1 by means of etching, preferably by means of reactive-ion etching ("transfer of pattern into hBN" in FIG. 4), which is explained in the following referring to FIG. 1*c*.

Figure 1C:
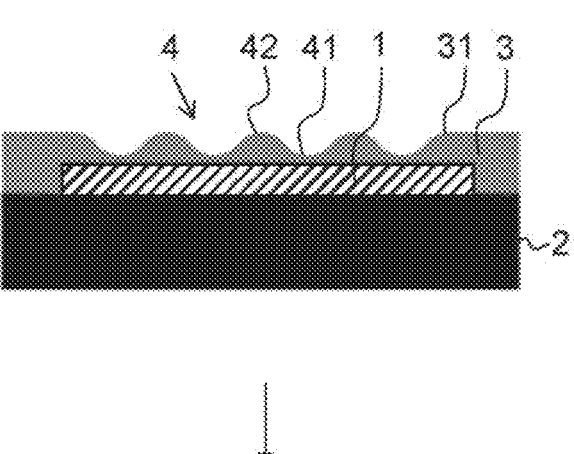
FIG. 1*c* shows a schematic illustration of a third step of the method of producing a nano-structured hBN-element according to the first inventive embodiment, wherein the relief structure is transferred from the resist into the hBN-element by means of etching.
Figure 1C:
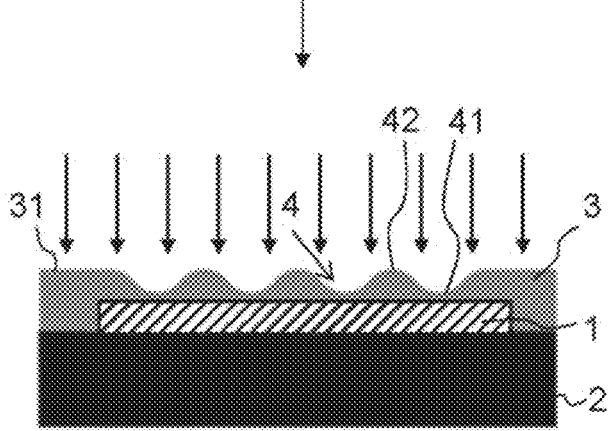
Figure 1C:
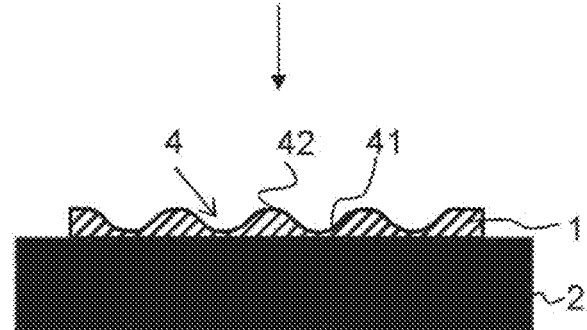

The patterned polymer resist 3 placed on the hBN-element 1 as obtained after carrying out the thermal scanning-probe lithography in FIG. 1*b* is shown in the top of FIG. 1*c*. For transferring the relief structure 4 from the polymer resist 3 into the hBN-element 1, etching, preferably reactive-ion etching, is carried out (FIG. 1*c*, in the middle). During this process, the material of the resist 3 and parts of the hBN-element 1 are removed, such that a nano-structured hBN-element 1 is obtained comprising the relief structure 4. In case reactive-ion etching is used to transfer the relief structure 4, inductively coupled plasma etching using sulfur hexafluoride ($SF_6$) can e.g. be applied. The hBN-element 1 can then be removed from the substrate 2 and used for various purposes e.g. in the field of optoelectronics or nanophotonics.

Figure 2:
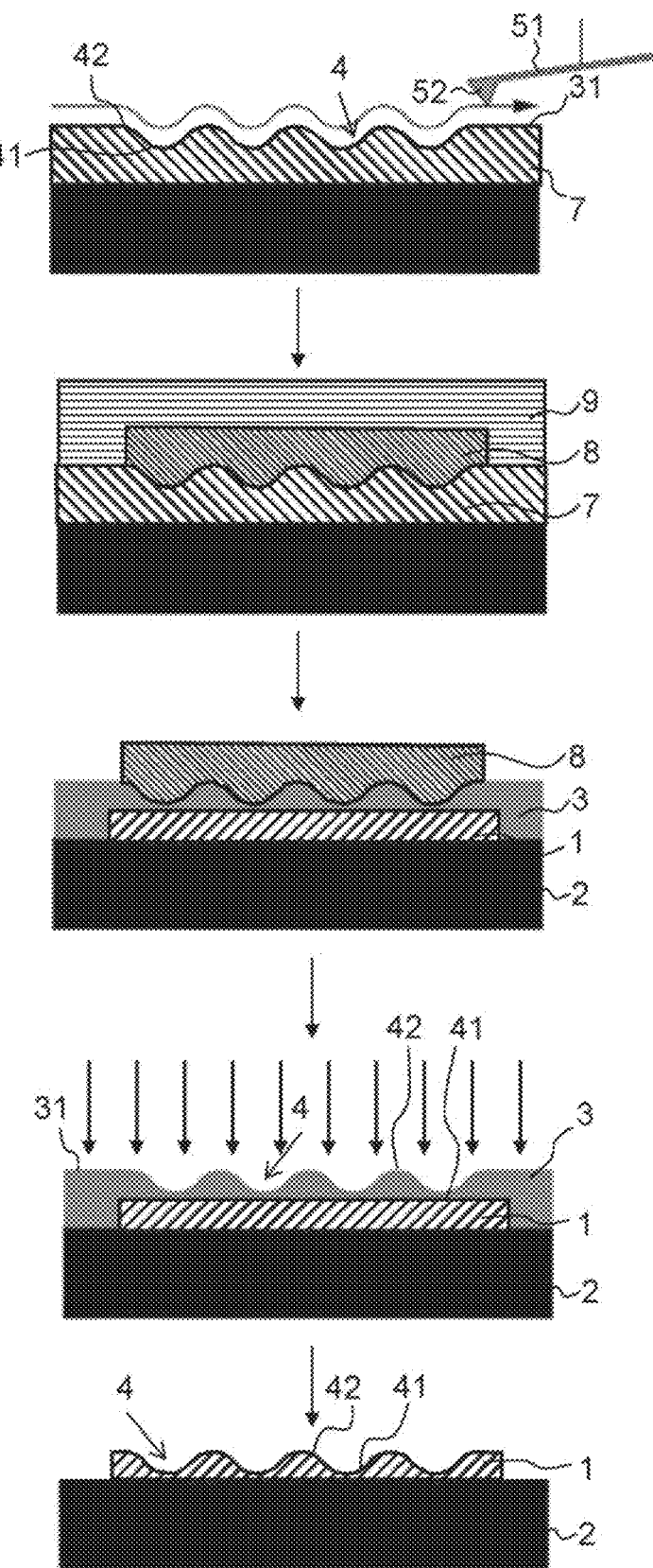
FIG. 2 shows a schematic illustration of a method for producing a nano-structured hBN-element according to a second inventive embodiment, wherein a relief structure is produced in an imprint-substrate by means of thermal scanning-probe lithography for molding a stamp, in order to create a relief structure in a resist by means of the stamp and transferring the relief structure from the resist into the hBN-element by means of etching (nanoimprint-lithography)

A method according to a second inventive embodiment for producing a nano-structured hBN-element is shown in FIG. 2: After depositing an imprint-substrate 7, e.g. by means of spin-coating, on the substrate 2, thermal scanning-probe lithography is applied, as described further above, in order to generate a relief structure 4 in the surface of the imprint-substrate. The imprint-substrate 7 is preferably made of a thermoplastic polymer-material. The imprint-substrate 7 containing the relief structure 4 produced in this way is then used to mold a stamp 8. For this purpose, a mold 9 can e.g. be used to form a closed cavity with the imprint substrate 7 and possibly with the substrate 2. Through one or several inlet conduits, which are not shown in FIG. 2, a liquid material is injected into the cavity until the cavity is completely filled. The injected material, which preferably, but not necessarily, is a metal, is then cooled and hardened before it is demoulded in the form of the stamp 8. The resulting stamp 8 comprises a negative of the relief structure 4 and can thus be used to imprint the relief structure 4 in the resist 3. For this purpose, the stamp 8 can be pressed into the resist 3, in order to generate the relief structure 4 therein. Since the same stamp 8 can be used for the production of a large number of hBN-elements 1 and/or of a large number of relief structures 4 in the same hBN-element 1, the production becomes particularly efficient. The respective process is also known under the name "nanoimprint lithography". After the imprinting of the relief structure 4 in the resist 3 by means of the stamp 8, etching, in particular reactive-ion etching is applied, as described further above with respect to FIG. 1*c*, in order to transfer the relief structure 4 from the resist 3 into the hBN-element 1.

Figure 3:
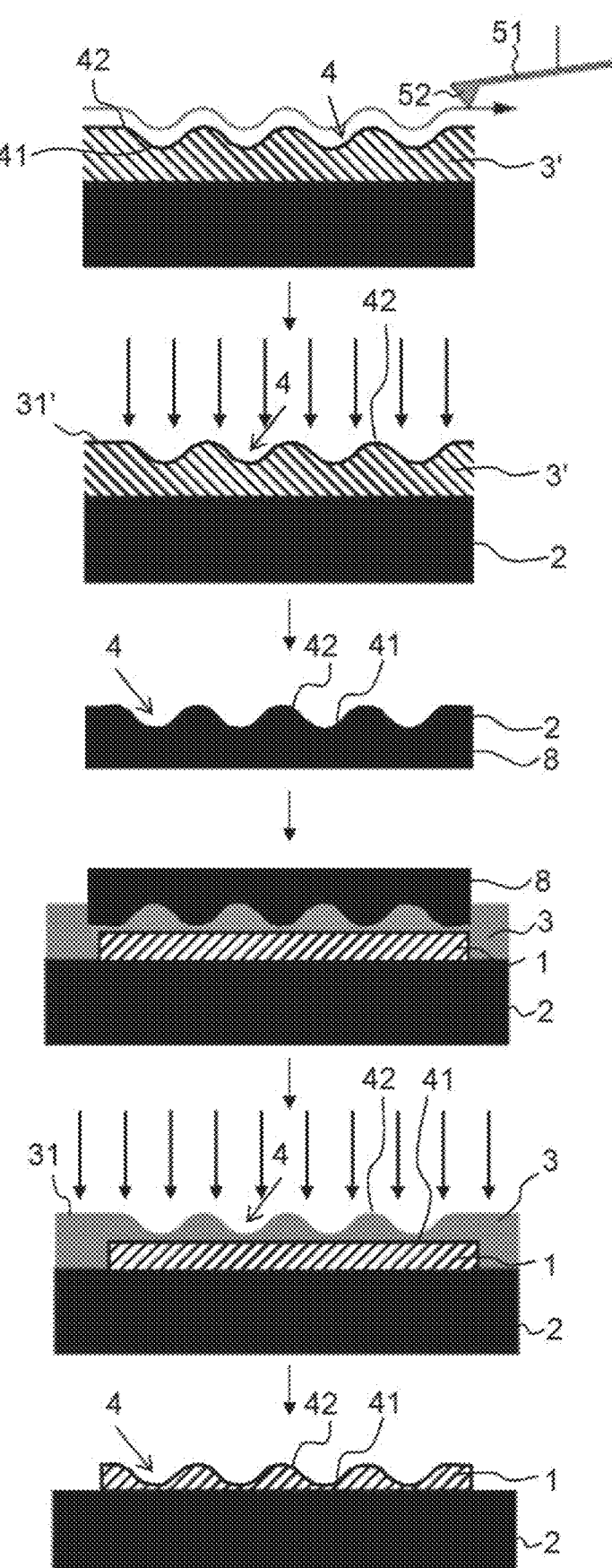
FIG. 3 shows a schematic illustration of a method for producing a nano-structured hBN-element according to a third inventive embodiment, wherein a relief structure is produced in a first resist by means of thermal scanning-probe lithography for etching a stamp, in order to create a relief structure in a second resist by means of the stamp and transferring the relief structure from the second resist into the hBN-element by means of etching (nanoimprint-lithography)

A method according to a third inventive embodiment for producing a nano-structured hBN-element is shown in FIG. 3: A relief structure 4 is patterned into the surface 31' of a first resist 3', in particular a first polymer resist, by means of a probe 51 of a processing device 5 adapted for thermal scanning-probe lithography. Etching is then applied, preferably reactive-ion etching, for transferring the relief structure 4 from the first resist 3' to an underlying substrate 2, which is preferably a silicon-substrate. In this etching process, the entire first resist 3' is removed. The further steps are then the same as explained with respect to FIG. 2: The substrate 2, which has been patterned in this way, serves as a stamp 8 for patterning a second resist 3. From the second resist 3, the relief structure 4 is transferred into an hBN-element 1 by means of etching (nanoimprint lithography). Instead of directly serving as the stamp 8, the patterned substrate 2 could also be used as a part, e.g. an insert, of a mold for molding the stamp 8. In this way, the stamp 8 could be made of a different material than the substrate 2. Nickel, in particularly a nickel-alloy, would be a particularly preferred material for the stamp 8 in this case.

The respective flow diagram of these second and third inventive embodiments of the method using nanoimprint lithography is also shown in FIG. 4, when additionally considering the parts marked by dashed lines. From FIG. 4 it follows, that the additional steps for the nanoimprint lithography as compared to the first embodiment of FIGS. 1*a*-1*c* concern the generation of the relief structure 4 in the imprint-substrate 7 ("pattern imprint-substrate or resist" in FIG. 4) by means of thermal scanning-probe lithography and the creation of the stamp 8 using the patterned imprint-substrate 7 or resist 3' ("creating of a stamp"). In the subsequent step ("pattern resist"), the relief structure 4 is then generated by means of the stamp 8 instead of thermal scanning-probe lithography as in the embodiment of FIGS. 1*a*-1*c*.

Figure 5:
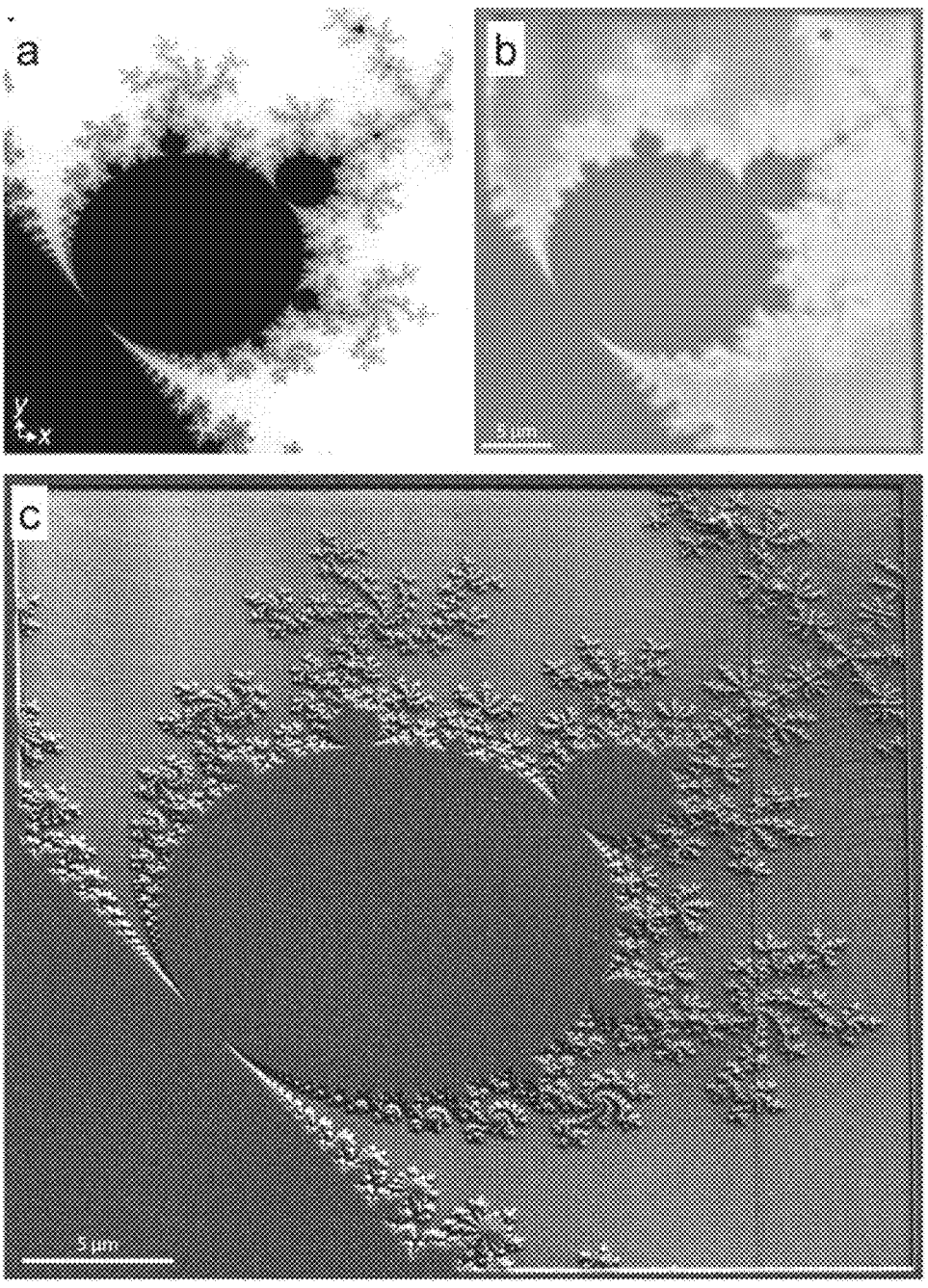
FIG. 5 shows freeform nanostructuring of hBN, wherein: a shows a grayscale-bitmap with a Mandelbrot set to be transferred on a polymer resist, in order to produce an hBN-flake in an experiment (depth range of ~80 nm, with black (white) being the highest (lowest) point in the pattern); b shows an optical microscope image of the hBN-flake with the Mandelbrot pattern; and c shows a scanning-electron microscopy (SEM)-image (30° tilt) of the such produced hBN-flake.
Figure 6:
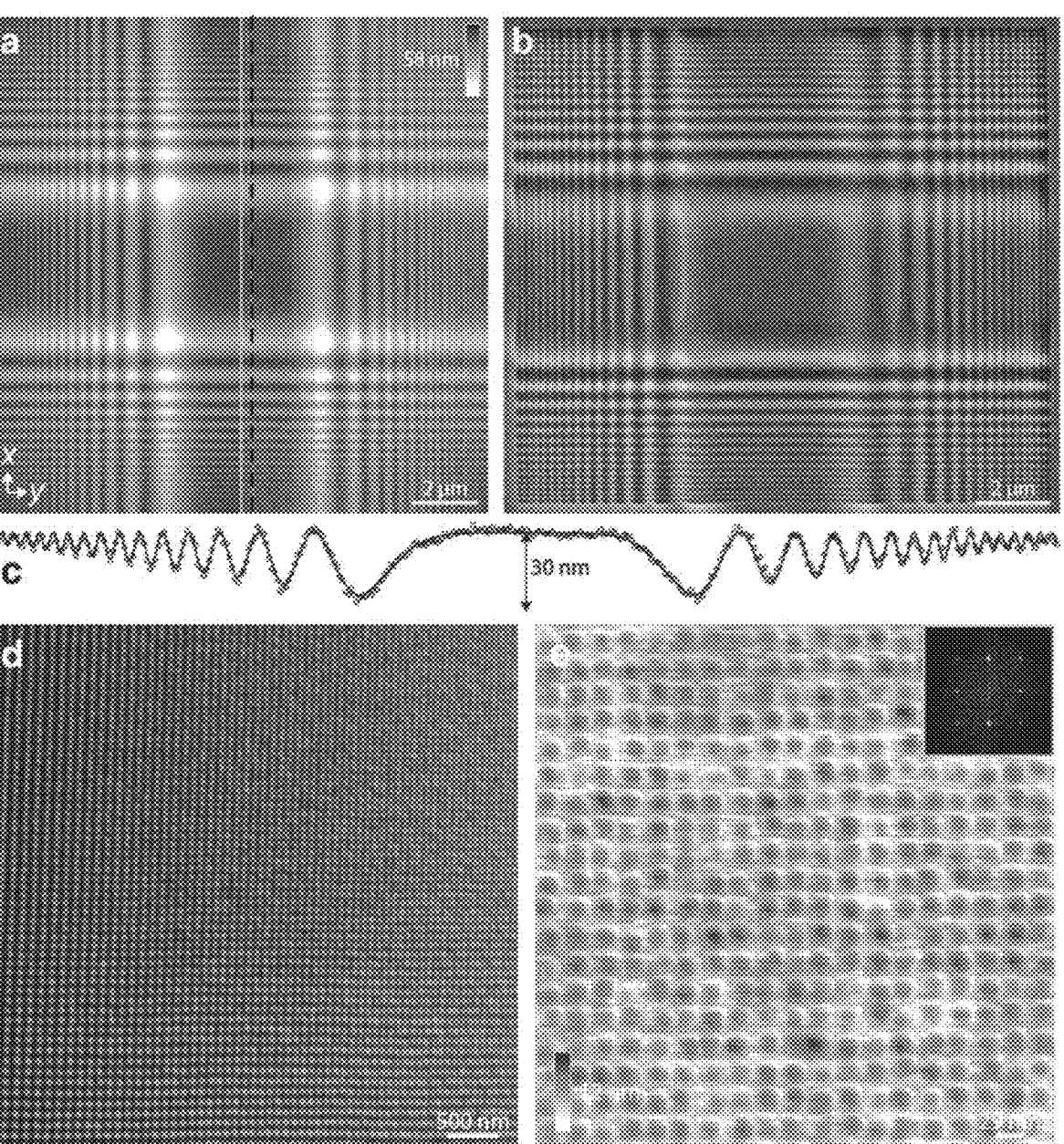
FIG. 6 illustrates the capabilities of freeform nanostructuring of hBN, wherein: a shows a grayscale-bitmap (left half) used to produce an hBN-flake with a respective relief structure in another experiment as well as image data of an atomic force microscope (AFM) of the such produced hBN-flake (right half); b shows an SEM-image (30° tilt) of a different hBN-flake with both sides of the resolution target in FIG. 6a; c shows measured (circles) and targeted (through-line) surface topographies for the structure on the right half of FIG. 6a (dashed line); d shows an SEM-image (30° tilt) of an hBN-flake with a high resolution relief structure that is based on an extension of a corner region of the pattern of FIG. 6a (from ~95 (bottom-left corner of the image) to ~50 nm (top-right corner); and e shows the measured topography (e, AFM) for a high-resolution square-lattice structure with a period of 29 nm, with the image inset representing the fast Fourier transform (FFT) of the topography data.

As follows from the description of FIGS. 1-4 above, the inventive method allows to exploit the straightforward mathematical design of the final structure. A grayscale bitmap controls the depth (z) of tip 52 at each in-plane 'pixel' (x, y) during the scan. Thus, by converting analytical profiles to high-resolution bitmaps, desired patterns or relief structures 4 can be easily fabricated. For example, FIG. 5 demonstrates an hBN flake structured with a portion of the Mandelbrot set. This challenging fractal pattern was chosen as it requires features with continuously varying depth over a wide range of optical and electronic length scales. The design bitmap (FIG. 5*a*) assigns one of 256 depth levels (8 bit) to each 15×15 nm$^2$ pixel. FIG. 5*b* presents an optical micrograph of the Mandelbrot pattern transferred into hBN. Colors (which have been converted in different grayscale tones) arise in reflection due to thickness-dependent optical interference in the flake. However, because the pattern contains features beyond the resolution of the used optical microscope, scanning-electron microscopy (SEM) is required to reveal the intricate self-similar features that persist down to a few tens of nanometers (FIG. 5*c*).

The limiting resolution in such a pattern is set by several factors. Most importantly, the in-plane resolution decreases as the depth increases due to the usual conical shape of the probe 51. A fresh probe tip 52 preferably has a radius (R) of ~3 nm and an estimated half-angle $\theta_{half}$ (see FIG. 9) of 16°, which sets the minimum in-plane feature size for a given depth vd. Furthermore, the profile is initially written in the polymer film formed by the polymer resist 3, which is ideally thin to avoid prolonged etching during the subsequent transfer step into hBN. However, if the polymer resist 3 is too thin, unwanted thermal transport from the tip 52 to the underlying polymer increases, limiting quality of the relief structure 4. This trade-off sets a lower limit on the thickness T of the polymer resist 3 in the region of the hBN-element 1 (see FIG. 1*b*) and, consequently, the pattern roughness of the relief structure 4 that is accumulated during etching, which affects the minimum feature size in the final hBN structure.

FIG. 9 illustrates the relationship of the shape and dimensions of the probe tip 52 used for the thermal scanning-probe lithography with regard to the resolution and depth of the relief structure 4 produced in the final hBN-element 1:

The preferred conical shape of the thermal scanning probe 51, combined with mechanical deformations in the polymer resist 3 (or 3'), set the lower limit on in-plane periodicity for a given depth vd. This limit can be estimated as follows. A fresh probe 51 preferably has a tip diameter at the apex as low as 6 nm and half-angle of 15-30°. It is noted that these quantities vary from probe to probe due to fabrication tolerances. Thus, the probe width is a function of the distance from the tip, set by the pattern depth. For a periodic structure, the relationship between the minimum periodicity, $\Lambda_{min}$, and the pattern depth, d (d=vd), can be written as:

$$\Lambda_{min} = 2w(d) = 2(w_0 + 2d\tan\theta_{half} + w_m))$$

where w(d) is the width of the indent (w(d)=hd), $w_0$ is the probe width at the apex ($w_0$=2R), $\theta_{half}$ is the opening half-angle of the probe tip, and $w_m$ represents additional feature broadening beyond the probe shape due to mechanical deformations. The prefactor of 2 arises from the assumption that a periodic structure will have a period twice as wide as the indent caused by the probe 51. It is noted that in practice contamination will increase the size of the probe 51, which can further increase $\Lambda_{min}$. Furthermore, roughness accumulated during etching can additionally increase $\Lambda_{min}$ for the final pattern in hBN.

Considering the above factors, preferred conditions for high-resolution patterning of hBN were identified. A 'freeform resolution target' was then designed and fabricated that contains a controlled range of pattern depths and spatial frequencies. The left half of FIG. 6*a* shows the bitmap; the right half presents atomic force microscopy (AFM) data of the experimental surface profile in hBN. The side-by-side comparison reveals good qualitative agreement. This is further supported by an SEM image of a full resolution target in hBN (FIG. 6*b*). To extract quantitative information, FIG. 6*c* compares the fabricated (AFM, black circles) and targeted (black through-line) surface profiles for a single line scan through the middle of the resolution target (white dashed line, FIG. 6*a*). A root-mean-square (RMS) depth error of 1.3 nm was extracted. For comparison, the RMS roughness of the flat etched hBN was ~0.5 nm; the value for a pristine flake was reported as ~0.1 nm. For the entire structure in FIG. 6*a*, a 2D function was fitted to the full topography map, obtaining an RMS error of 3.5 nm. The fabricated profile follows the target well, even for shallow depth modulations (~2 nm amplitude) and increasing spatial frequencies (~150 nm period) at the edge of the pattern (FIG. 6*c*).

The freeform resolution target in FIG. 6*a* was calculated with the expression:

$$f(x, y) = -(A - m|x|)\sin[(kx)^3]^2 - (A - m|y|)\sin[(ky)^3]^2 - \Delta$$

where A is the initial amplitude at the origin, m describes the linearly decreasing amplitude away from the origin, k=2π/Λ is the spatial frequency at the origin with Λ=12.5 μm, and Δ is the vertical offset. The lateral size of the pattern was chosen to be 15.03×8.49 μm$^2$, mapped onto a 10×10 nm$^2$ pixel grid.

As this pattern had not yet reached the limit of the process, the freeform resolution target in FIG. 6*a* was extended at its corners to higher-resolution features at shallow modulation depths (~5 nm). FIG. 6*d* shows an SEM image of the resulting hBN flake. This region spans periodicities from ~95 (bottom-left corner) to ~50 nm (top-right corner). Clear lattices persist over these length scales. Thus, to determine the ultimate resolution, a series of structures was fabricated, each with a fixed spatial frequency on a 2D square lattice (with periodicities from 35 to 25 nm). FIG. 6*e* shows measured topography (AFM) for an hBN lattice with 29 nm periodicity and a depth of ~5 nm. This represented the limiting resolution with the applied method settings for a high-quality pattern, based on a Fourier analysis of the topography data. Although smaller periodicities were possible to pattern (20 nm in the polymer; 25 nm in hBN), increasing disorder became apparent. The experimental resolution versus depth is close to the theoretical limit imposed by the shape of the probe 51 (see FIG. 9 and the description above with regard to FIG. 9).

These results establish that freeform nanostructures in hBN can be created on optical and electronic length scales.

Figure 7:
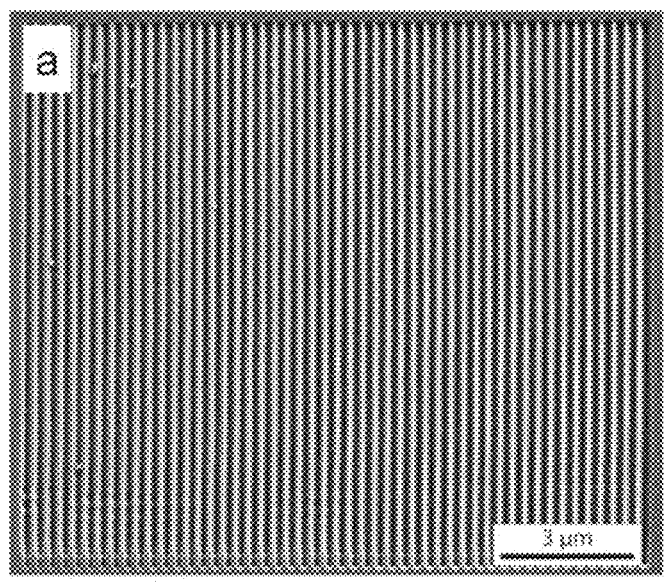
FIG. 7 shows hBN grating couplers, wherein: a shows an SEM image of a sinusoidal grating coupler patterned in an hBN flake; b schematically shows the optical setup used for the guided-mode coupling measurements; and c shows the angle-resolved spectra (energy versus in-plane wavevector, $k_x$ with $k_y$~0) for light outcoupled from the second grating, measured using the setup in FIG. 7b.
Figure 7:
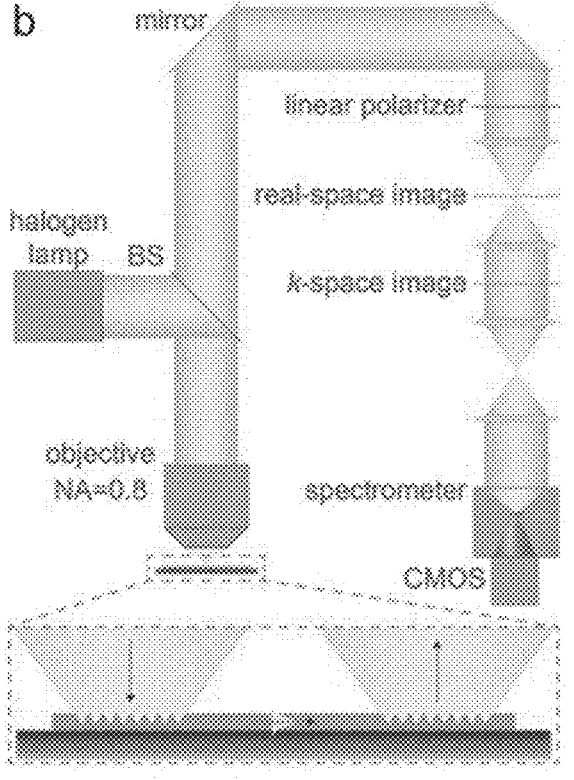
Figure 7:
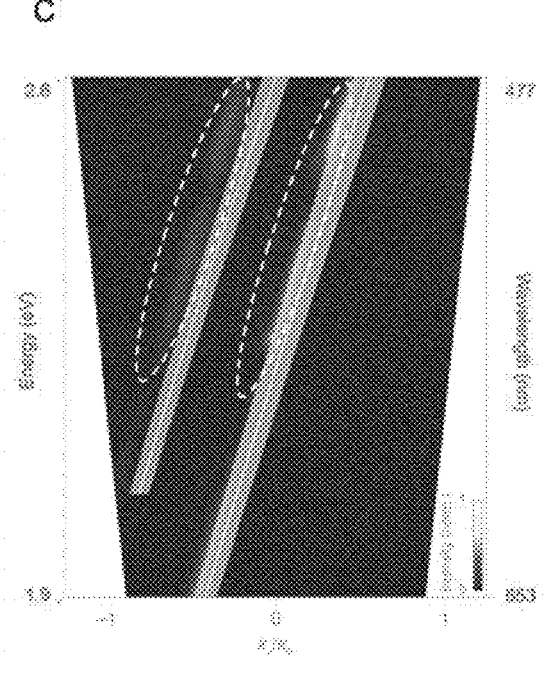

FIG. 7 shows an application in the field of optics of an hBN-element 1 produced according to the inventive method. In FIG. 7*a*, an SEM image of a sinusoidal grating coupler patterned as a relief structure 4 in an hBN-element 1 (255 nm thick) is shown. The respective optical setup used for the guided-mode coupling measurements is schematically shown in FIG. 7b. The setup is used to couple broadband light into a guided-mode in the hBN with the first grating. The mode then propagates toward the second grating and is out-coupled. The outcoupled light is analyzed in k-space. FIG. 7c shows the resulting angle-resolved spectra (energy versus in-plane wavevector, $k_x$ with $k_y \sim 0$) for light out-coupled from the second grating, measured using the setup in FIG. 7b. The wavevector is relative to $k_0=2\pi/\lambda_0$, where $\lambda_0$ is the free-space wavelength of the photon. The light streaks encircled by dashed lines are the experimental data. The white diagonal lines show the calculated dispersion curves for the TE0 and TE1 modes, diffracted into the light cone by the grating. The greyscale-shaded regions represent a ±3% uncertainty on the reported indices of refraction for hBN.

2D electronics can also benefit from nano-structured hBN-elements 1 with relief structures 4 having freeform profiles at shorter length scales. In particular, the propagation and interactions of electrons in nearby active layers can be manipulated. This possibility, known as electronic band-structure engineering, can be implemented through specific modulations of the hBN profile. Dielectric superlattices known in the prior art have lattice structures that are constrained to basic patterns (for example, arrays of holes) approachable by standard lithography. With the inventive method, patterning of hBN-elements 1 at nanoscale resolutions using mathematically defined freeform profiles becomes possible. As a specific class of such structures, electronic Fourier surfaces as described by Lassaline, N., Brechbühler, R., Vonk, S. J., Ridderbeek, K., Spieser, M., Bisig, S., Le Feber, B., Rabouw, F. T. & Norris, D. J. *Optical Fourier surfaces. Nature* 582, 506-510 (2020) can be indicated, which superimpose a set of sinusoidal profiles to precisely control the spatial frequencies. FIG. 8a shows a bitmap of a hexagonally symmetric electronic Fourier surface, defined by summing three sinusoids with 50 nm period, but rotated in plane by 0, 60, and 120°. The inset in the top right corner of the figure shows the fast Fourier transform (FFT) of the bitmap, revealing the hexagonal lattice symmetry. This pattern is then written in the polymer resist 3; FIG. 8b plots the topography measured during this process. From the real-space profile and FFT (inset), it can be seen that the wavy hexagonal lattice is accurately reproduced. After reactive-ion etching, the same profile is replicated in hBN (FIG. 8c).

More importantly, such structures can be extended to more sophisticated profiles. FIG. 9d shows a bitmap of an electronic Fourier surface with a moiré pattern, generated when two hexagonal lattices as in FIG. 8a (50 nm periodicity) are combined, with one rotated in-plane by 10°. FIGS. 8e,f confirm that this more complicated topography is reproduced in the polymer resist 3 and in the hBN-element 1, respectively. The FFTs also clearly indicate the presence of two hexagonal lattices. Similarly, FIGS. 8g-i demonstrate an electronic Fourier surface (the bitmap, polymer resist 3, and hBN-element 1, respectively) containing two aligned hexagonal lattices but with different periods (55 and 47 nm). Finally, for FIGS. 8j-l, a quasicrystalline moiré profile was designed and fabricated from nine sinusoids (all with 50 nm periods, but 20° rotation between them). These structures confirm the ability to mathematically design and then experimentally generate high-resolution electronic lattices in the hBN-elements 1. Such profiles, which can cover large areas (e.g. 10×10 μm²), will modulate the electric field felt in a nearby active layer, as can be seen from a synopsis with the description of FIG. 10 further below and the simulations shown in FIG. 10. Beyond electronic Fourier surfaces, the inventive method is amenable to any bitmap design within some limitations.

Figure 8:
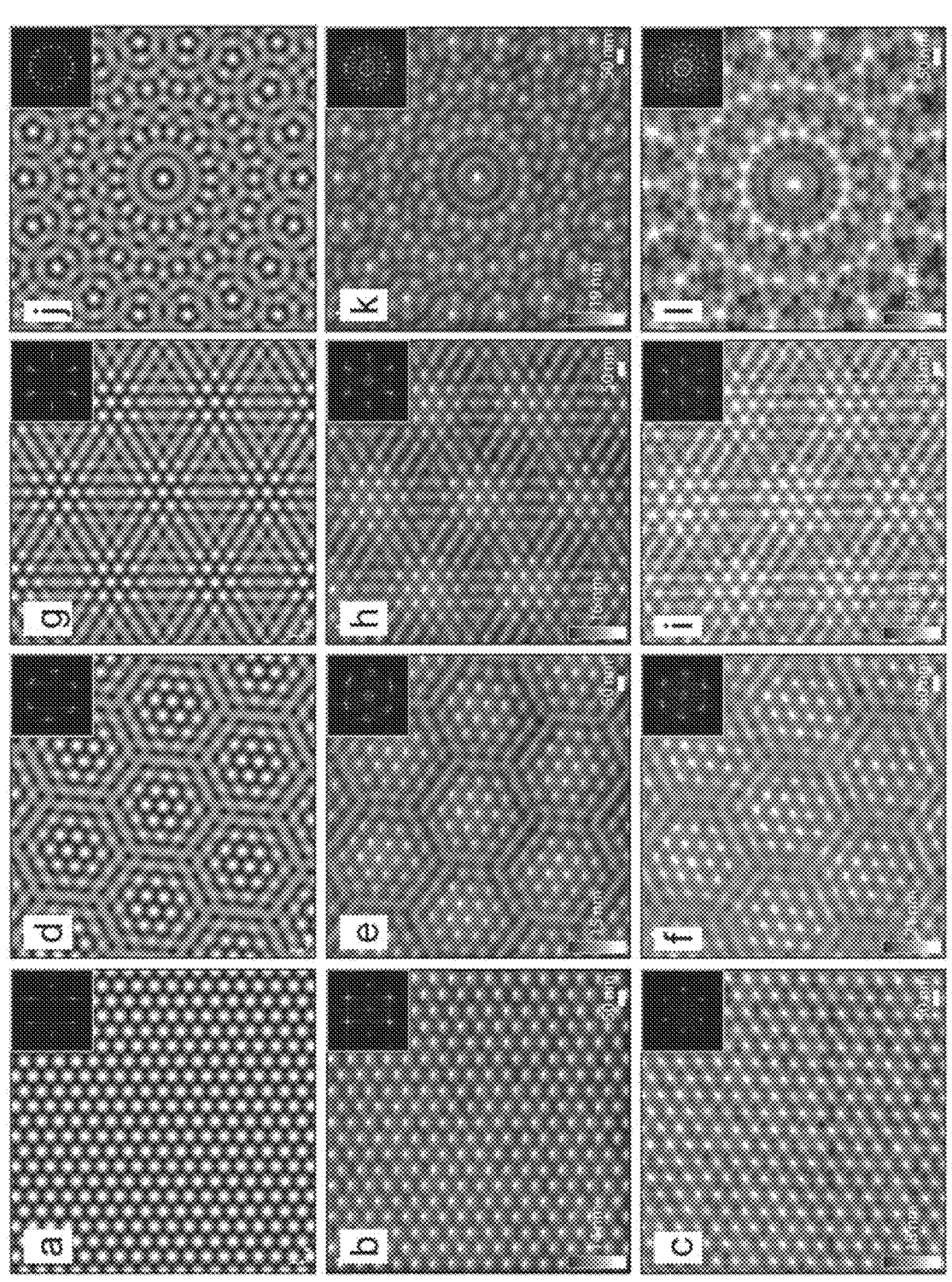
FIG. 8 shows electronic Fourier surfaces in hBN, wherein: a shows a bitmap of an electronic Fourier surface with a hexagonal lattice, defined by superimposing three sinusoids of period 50 nm rotated in plane by 0, 60, and 120°; d shows a bitmap generated by superimposing two hexagonal lattices (as in a) with one lattice rotated in plane by 10°; g shows a bitmap of two superimposed hexagonal lattices (as in a), with spatial periods of 55 and 47 nm and no in-plane rotation; and j shows a bitmap of nine superimposed sinusoids of period 50 nm, rotated in plane by 0, 20, 40, 60, 80, 100, 120, 140, and 160°; b, e, h, k show measured topographies (obtained during patterning) of the bitmaps in a, d, g, j, respectively, written in the polymer resist; c, f, i, l show measured topographies (AFM) of the patterns in b, e, h, k, respectively, etched into hBN flakes. Insets show FFTs for each pattern.
Figure 9:
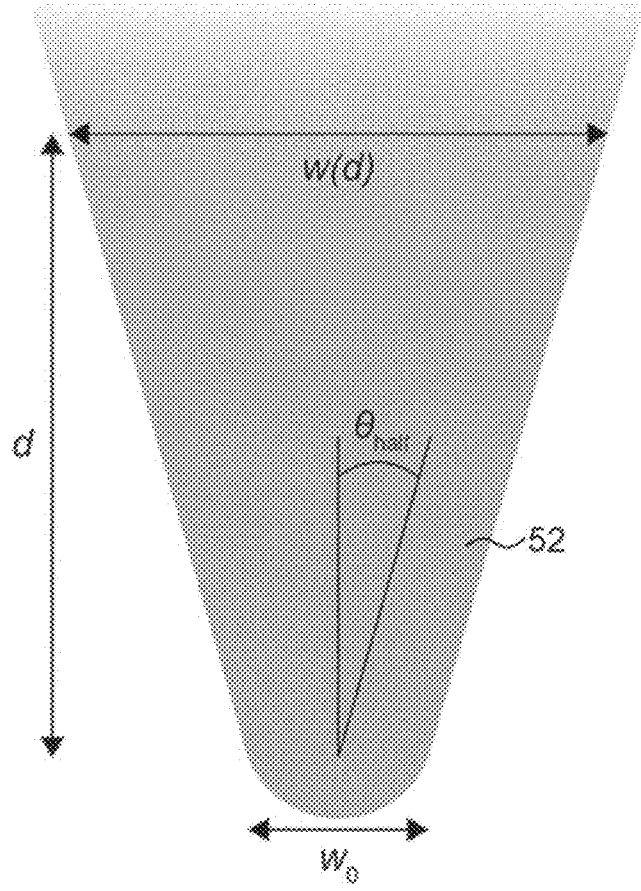
FIG. 9 schematically shows the cross-sectional shape of the probe tip used in thermal scanning-probe lithography to pattern the polymer film (A fresh probe has a tip diameter ($w_0$) down to 6 nm and a half-angle ($\theta_{half}$) of 15-30°. Thus, the probe width [w(d)] is a function of the distance from the tip (d))

The high-resolution pattern in FIG. 6e and the electronic Fourier surfaces in FIG. 8 were calculated using:

$$f(x, y) = \sum_i A_i \cos(k_i[x\cos\theta_i + y\sin\theta_i]) - \Delta$$

where $A_i$, $k_i$, and $\theta_i$ correspond to the amplitude, spatial frequency, and in-plane rotation angle, respectively, for component i. $\Delta$ is the vertical offset. For the high-resolution pattern in FIG. 6e, the lateral size was 580×580 nm², mapped onto a 2.9×2.9 nm² pixel grid. For the electronic Fourier surfaces in FIG. 8, the lateral size was 1×1 μm², mapped onto a 5×5 nm² pixel grid.

Figure 10A:
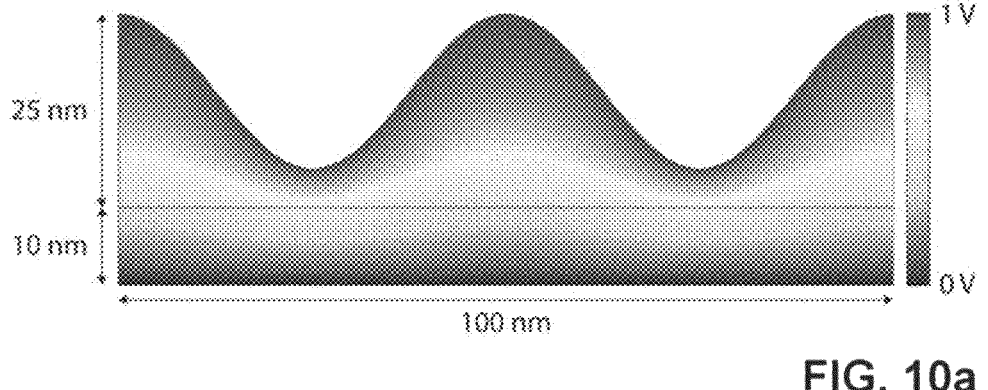
FIG. 10a shows a simulation of a single-sinusoidal electronic Fourier surface in hBN with a period of 50 nm (The top hBN has a thickness of 25 nm with a 20 nm depth modulation. The bottom hBN has a thickness of 10 nm and is unstructured. The thin horizontal black line in between the two hBN layers represents the active layer, which could be a monolayer such as $MoS_2$. A voltage of 1 V is applied to the top surface, representing a top gate, and a voltage of 0 V is applied to the bottom surface, representing a back gate. The color map represents the electric potential at every point throughout the structure.)

FIGS. 10a-10d show the results of an electrostatic simulation of a layered heterostructure comprising two layers of hBN with an active 2D layer in-between. In FIG. 10a, a simulation is shown of a single-sinusoidal electronic Fourier surface in hBN with a period of 50 nm.

Figure 10B:
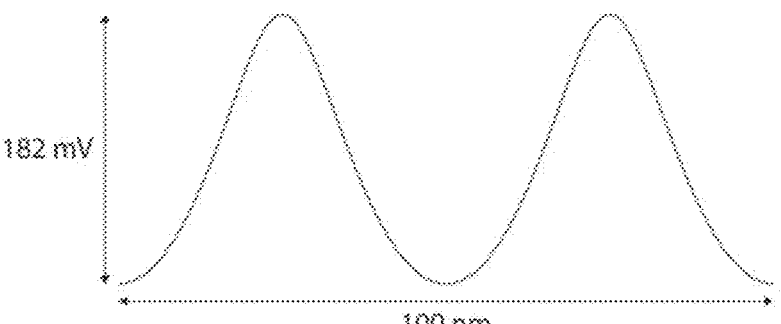
FIG. 10b shows the simulated electric-potential profile at the active layer (thin black horizontal line in FIG. 10a) when 1 V is applied to the structure in FIG. 10a (The surface profile in the top hBN is revealed in the field profile.)
Figures 10C, 10D:
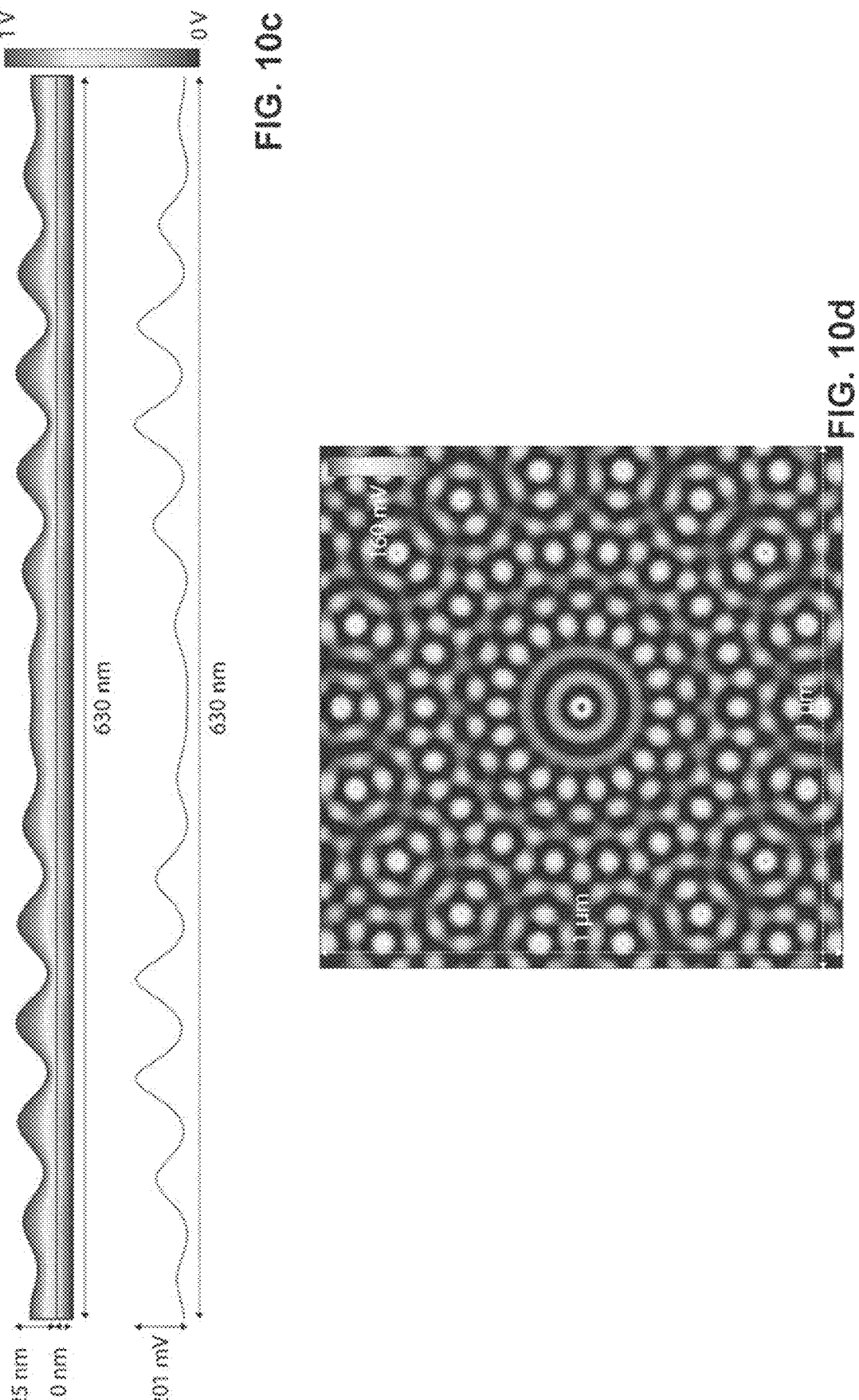
FIG. 10c shows the same simulation as in FIG. 10a, but for a 2-component sinusoid with periods of 55 and 47 nm (upper half) and, in the lower half, the simulated electric-potential profile at the active layer (thin black horizontal line in the upper half of the figure) when 1 V is applied to the structure shown in the upper half of the figure.
FIG. 10d shows the 3D simulation in analogy of FIG. 10b and the lower half of FIG. 10c, but for the quasicrystal structure from FIG. 8l, defined with 9 sinusoids, each with 50 nm period.

The top hBN-element has a thickness of 25 nm with a 20 nm depth modulation. The bottom hBN-element has a thickness of 10 nm and is unstructured, i.e. has flat surfaces. The thin horizontal black line in between the two hBN layers represents the active layer, which could for example be a monolayer such as $MoS_2$. A voltage of 1 V is applied to the top surface, representing a top gate, and a voltage of 0 V is applied to the bottom surface, representing a back gate. The grayscale map represents the electric potential at every point throughout the structure. FIG. 10b shows the simulated electric-potential profile at the active layer (thin black horizontal line in FIG. 10a) when 1 V is applied to the structure in FIG. 10a. The surface profile in the top hBN is revealed in the field profile. FIG. 10c shows the same simulation as in FIGS. 10a,b, but for a 2-component sinusoid with periods of 55 and 47 nm. FIG. 10d shows a 3D simulation in analogy to the one of FIGS. 10b,c, but for the quasicrystal structure of FIG. 8l, defined with 9 sinusoids, each with 50 nm period. Thus, the simulations of FIGS. 10a-10d show that it is possible to produce nano-structured hBN-elements in accordance with the inventive method that modulate the electric field felt in a nearby active layer In a concrete experimental embodiment, the polymer resist 3 for thermal scanning-probe lithography, PMMA/MA [AR-P 617, poly(methyl methacrylate-co-methacrylic acid), 33% copolymer, diluted to either 1.5 or 3 wt % in 1-methoxy-2-propanol] was purchased from Allresist GmbH. Silicon cantilevers (MBS 2019-12) for thermal-scanning probe lithography were purchased from Heidelberg Instruments Nano. Acetone and isopropyl alcohol (IPA) were provided by the Binnig and Rohrer Nanotechnology Center (BRNC) at IBM Zurich, where the fabrication was performed.

Silicon wafers with 285 nm of $SiO_2$ were diced into chips of approximately 2×2 cm² area. Next, hBN flakes were deposited on the substrate using a mechanical exfoliation technique. Repeated sticking and peeling of the hBN crystal to blue tape thinned the bulk crystal down to flakes with thicknesses in the range of tens to hundreds of nanometers. After approximately 5-7 iterations of crystal thinning, adhesive tape was applied to the crystal and removed. The adhesive tape with the thinned-down crystal was then placed on the Si/SiO₂ substrate (sticky side down) and a small vial filled with water was used as a weight to apply pressure to the top side of the tape. The substrate with tape was placed on a metal support and transferred to a hotplate, where it was heated for 1 min at 150° C. After 1 min, the metal support containing the sample was removed and allowed to cool for 1 min. The tape was peeled off at a slow and uniform rate, leaving hBN flakes on the substrate ready for patterning.

PMMA/MA polymer resist was spin-coated onto the chip containing hBN flakes using a two-step procedure. The resist was dispensed onto the sample surface, which was then accelerated at 500 r.p.m. s$^{-1}$ to 500 r.p.m. for 5 s. Next, the spinning speed was increased at 2000 r.p.m. s$^{-1}$ to the final spin speed (2000-6000 r.p.m., depending on the required thickness) for a total time of 40 s. After spin-coating, the sample was baked at 180° C. for 5 min.

The sample was then placed on the stage of the thermal scanning-probe lithography tool (NanoFrazor Explore, Heidelberg Instruments Nano); the flake of interest was centered and rotationally aligned under the optical microscope of the tool. A cantilever was loaded into the cantilever holder, which was then attached to the Nanofrazor scan head. The probe tip was brought near the sample surface, and an automated approach function was used to find the sample surface and bring the tip into contact. The tip was then moved away from the flake to perform calibration scans. After calibration, the tip was optically aligned over the flake of interest. Next, the thermal scanning probe performed a topography scan of the polymer surface on top of the flake for fine alignment of the pattern and to ensure that the surface was relatively flat and smooth in the local pattern area. The thermal scanning probe then started fabricating the desired relief structure and proceeded until the entire relief structure was in the polymer resist. Afterwards, the thermal scanning probe was available to write the next relief structure on either the same flake or a different flake on the same chip.

Once thermal scanning-probe lithography was completed, the relief structure was transferred to the underlying hBN flake via inductively coupled plasma (ICP) etching (Oxford Instruments, PlasmaPro) using a gas content of 50 sccm SF$_6$. The etching was performed with a chamber pressure of 40 mTorr, a forward power of 75 W, and at a rate of ~2 nm s$^{-1}$ until the polymer resist was completely removed. The pattern was transferred to the underlying hBN with approximately 1:1 depth, indicating little to no pattern amplification. After etching, the sample was sonicated for 2 min in acetone, rinsed with IPA, and blown dry with N$_2$ gas.

The topography of the patterns in the polymer resist was measured by the thermal scanning probe during the patterning process, and afterwards the final pattern in hBN was measured using an AFM (Bruker, Dimension FastScan, NCHV-A cantilever) using tapping mode in ambient conditions. The topography data was processed using a custom MATLAB script that performed row alignment, plane levelling, and function fitting to extract structural parameters, RMS roughness, and error values.

The high-resolution (25-35 nm periodicity) square lattices were measured using an AFM in non-contact mode. To extract a quantitative measure of the lattices, Fourier analysis was used on the measured topography data. The 2D FFT of the topography data revealed peaks (along k$_y$ at k$_x$=0, and along k$_y$ at k$_x$=0) that correspond to the fundamental spatial frequency of the lattice. The ratio of the fundamental peak height to the next-highest peak in the Fourier spectrum was taken as a quantitative measure of the lattice quality. A threshold of 5 was chosen for this ratio as the criterion for a high-quality lattice. The lattice with 29 nm periodicity was the shortest period that had a ratio greater than 5 (5.05).

Thus, 29 nm was identified as the limiting spatial resolution for this concrete experimental embodiment with the settings chosen as indicated.

The high-fidelity structuring of hBN-elements 1 achievable by the inventive method exploits the simple combination of thermal scanning-probe lithography and etching, in particular reactive-ion etching, to accurately replicate freely varying mathematical landscapes in hBN. In addition to integrated photonic microelements that modify photon flow, such control can modulate mechanical, electrostatic, and electromagnetic environments for 2D materials. For example, it is conceivable to exploit moiré periodicities induced by the rotation angle between two stacked monolayers of graphene (twisted bilayers). Freely patterned hBN should provide a more flexible and integrated approach to engineer strain, electronic band-structure, and cavity quantum electrodynamics. Thus, combining freeform nano-structured hBN-elements 1 with other 2D materials could provide a new platform to access, discover, and exploit exotic states of matter in quantum materials.

The invention claimed is:

1. A method for producing a nano-structured element made of hexagonal boron nitride (hBN), comprising the steps of:
    a.) placing a resist on the hBN-element;
    b.) generating a relief structure in the surface of the resist; and
    c.) transferring the relief structure from the resist into the hBN-element by means of etching,
    wherein the relief structure of the nano-structured element is configured to modulate an electric field in a nearby active layer.

2. The method according to claim 1, wherein in step b.), thermal scanning-probe lithography is used to generate the relief structure directly in the surface of the resist.

3. The method according to claim 1, wherein in step b.), a stamp comprising the relief structure is used to generate the relief structure in the surface of the resist.

4. The method according to claim 3, wherein thermal scanning-probe lithography is applied on an imprint-substrate, in order to generate the relief structure in the surface of the imprint-substrate, and wherein the imprint-substrate comprising the relief structure is then used to create the stamp.

5. The method according to claim 2, wherein for the thermal scanning-probe lithography, a probe is used with a probe tip having a radius of 8 nm or less and a half-angle of 30° or less.

6. The method according to claim 1, wherein, in step c.), reactive-ion etching is used to transfer the relief structure from the resist into the hBN-element.

7. The method according to claim 1, wherein in step a.), the resist is placed on the hBN-element by spin-coating a material that forms the resist over the hBN-element.

8. The method according to claim 1, additionally comprising the further steps of:
    (i) defining the relief structure in a computing device, whereby a model relief structure is obtained; and
    (ii) discretizing the model relief structure of step (i) into pixels in the computing device, whereby discretized controller data is obtained.

9. The method according to claim 8, wherein the discretized controller data is stored in a digital file.

10. The method according to claim 1, wherein the relief structure comprises a plurality of elevations and recesses, and wherein the minimal distance between at least one of a) two successive elevations and b) two successive recesses is smaller than about 100 nm.

11. The method according to claim 1, wherein the maximum depth of the relief structure is in a range between 4 nm and 20 nm.

12. The method according to claim 11, wherein the minimal distance between at least one of a) two successive elevations and b) two successive recesses is smaller than about 50 nm.

13. The method according to claim 1, wherein the resist has a thickness of between 1 nm and 1 μm.

14. The method according to claim 1, wherein the resist is a polymer resist.

15. A device comprising one or several nano-structured elements made of hexagonal boron nidride (hBN) and having a relief structure provided for influencing the electronic properties of the device in a targeted way, wherein the relief structure of the one or several nano-structured elements is configured to modulate the electric field in a nearby active layer.

16. The device according to claim 15, wherein the one or several nano-structured elements form an integrated part of a heterostructure with several layers that are held together by means of van der Waals forces.

17. The device according to claim 16, wherein the heterostructure is specifically configured to achieve a certain electronic, optical and/or mechanical effect.

18. The device according to claim 15, wherein the one or several nano-structured elements form an electronic Fourier-surface for modulating the electric field in the nearby active layer.

19. The device according to claim 15, wherein the one or several nano-structured hBN-elements are produced by means of a method comprising the steps of:

a.) placing a resist on the hBN-element;

b.) generating a relief structure in the surface of the resist; and c.) transferring the relief structure from the resist into the hBN-element by means of etching.

\* \* \* \* \*